(12) United States Patent
Kratzer et al.

(10) Patent No.: US 10,035,427 B2
(45) Date of Patent: Jul. 31, 2018

(54) METHOD AND DEVICE FOR THE OPEN-LOOP AND/OR CLOSED-LOOP CONTROL AT LEAST OF ONE OPERATING PARAMETER OF AN ELECTRICAL STORAGE DEVICE, WHEREIN SAID OPERATING PARAMETER INFLUENCES A STATE OF AGING OF AN ELECTRICAL ENERGY STORAGE DEVICE

(71) Applicant: MAN Truck & Bus AG, München (DE)

(72) Inventors: Sebastian Kratzer, München (DE); Elmar Kirchensteiner, Vierkirchen (DE); Bernd Müller, München (DE)

(73) Assignee: MAN TRUCK & BUS AG, Munich (DE)

(*) Notice: Subject to any disclaimer, the term of this patent is extended or adjusted under 35 U.S.C. 154(b) by 140 days.

(21) Appl. No.: 15/010,951

(22) Filed: Jan. 29, 2016

(65) Prior Publication Data
US 2016/0221465 A1 Aug. 4, 2016

(30) Foreign Application Priority Data
Jan. 29, 2015 (DE) .................. 10 2015 001 050

(51) Int. Cl.
*B60L 11/18* (2006.01)
*B60L 3/12* (2006.01)
(Continued)

(52) U.S. Cl.
CPC ............. *B60L 11/1862* (2013.01); *B60L 3/12* (2013.01); *B60L 11/187* (2013.01);
(Continued)

(58) Field of Classification Search
CPC ................ B60L 11/1862; G01R 31/3679
(Continued)

(56) References Cited

U.S. PATENT DOCUMENTS 4,888,716 A 12/1989 Ueno
6,103,408 A 8/2000 Richter
(Continued)

FOREIGN PATENT DOCUMENTS

DE 37 12 629 A1 10/1987
DE 197 50 309 A1 5/1999
(Continued)

*Primary Examiner* — Samuel Berhanu
*Assistant Examiner* — Tessema Kebede
(74) *Attorney, Agent, or Firm* — Lucas & Mercanti, LLP (57) ABSTRACT

A method and a device for the open-loop and/or closed-loop control of at least one operating parameter of an energy storage device, the operating parameter influencing a state of aging of the energy storage device, to prevent too great a deviation from a planned serviceable life of the energy storage device. The method includes determining an actual state of health and a desired state of health of the energy storage device, and adjusting an operating parameter range that is permissible for the at least one operating parameter range if a comparison of the actual state of health with the desired state of health demonstrates an increased rate or reduced rate of aging in comparison to the desired state of health, wherein the operating parameter range is adjusted so that the energy storage device is operated at a reduced or an increased rate of aging, respectively.

13 Claims, 2 Drawing Sheets (51) Int. Cl.
    *G01R 31/36* (2006.01)
    *G01R 31/00* (2006.01)
    *H02J 7/00* (2006.01)
    *H01M 10/48* (2006.01)
    *H01M 10/42* (2006.01)

(52) U.S. Cl.
    CPC .......... *B60L 11/1857* (2013.01); *G01R 31/00* (2013.01); *G01R 31/3679* (2013.01); *H01M 10/48* (2013.01); *H02J 7/0021* (2013.01); *H02J 7/0029* (2013.01); *H02J 7/0047* (2013.01); *B60L 2240/545* (2013.01); *B60L 2240/549* (2013.01); *H01M 2010/4271* (2013.01); *H01M 2220/20* (2013.01); *H02J 2007/004* (2013.01); *H02J 2007/005* (2013.01); *H02J 2007/0037* (2013.01); *H02J 2007/0039* (2013.01); *Y02T 10/705* (2013.01); *Y02T 10/7005* (2013.01); *Y02T 10/7044* (2013.01); *Y02T 10/7055* (2013.01)

(58) Field of Classification Search
    USPC ........................................................ 320/109
    See application file for complete search history.

(56) References Cited

U.S. PATENT DOCUMENTS

| | | | |
|---|---|---|---|
| 6,118,252 A | 9/2000 | Richter | |
| 6,534,992 B2* | 3/2003 | Meissner | G01R 31/3631 324/426 |
| 7,741,849 B2 | 6/2010 | Frey | |
| 8,294,416 B2 | 10/2012 | Birke et al. | |
| 9,184,475 B2* | 11/2015 | Mumelter | H01M 10/48 |
| 2009/0027056 A1* | 1/2009 | Huang | B60L 11/1857 324/439 |
| 2010/0019718 A1 | 1/2010 | Salasoo | |
| 2011/0156641 A1* | 6/2011 | Kishiyama | H02J 7/0073 320/109 |
| 2011/0313613 A1 | 12/2011 | Kawahara et al. | |
| 2012/0176096 A1* | 7/2012 | Mumelter | H01M 10/48 320/134 |
| 2012/0200257 A1* | 8/2012 | Schwarz | H01M 10/42 320/109 |
| 2012/0262125 A1* | 10/2012 | Fassnacht | B60L 3/0046 320/162 |
| 2013/0027048 A1* | 1/2013 | Schwarz | H01M 10/44 324/427 |
| 2013/0314042 A1* | 11/2013 | Boehm | B60L 11/1809 320/109 |
| 2014/0217958 A1 | 8/2014 | Verdun | |

FOREIGN PATENT DOCUMENTS

| | | |
|---|---|---|
| DE | 100 49 495 A1 | 4/2002 |
| DE | 103 28 721 A1 | 1/2005 |
| DE | 10 2007 010 751 A1 | 8/2008 |
| DE | 10 2007 063 178 A1 | 6/2009 |
| DE | 102009042656 A1 | 3/2011 |
| DE | 102009045784 A1 | 4/2011 |
| DE | 102011005711 A1 | 9/2012 |
| EP | 0841208 A1 | 5/1998 |
| WO | 2007048366 A1 | 5/2007 |
| WO | 2010121831 A1 | 10/2010 |

\* cited by examiner

METHOD AND DEVICE FOR THE OPEN-LOOP AND/OR CLOSED-LOOP CONTROL AT LEAST OF ONE OPERATING PARAMETER OF AN ELECTRICAL STORAGE DEVICE, WHEREIN SAID OPERATING PARAMETER INFLUENCES A STATE OF AGING OF AN ELECTRICAL ENERGY STORAGE DEVICE

CROSS-REFERENCE TO RELATED APPLICATIONS

The present application claims priority of DE 10 2015 001 050.6 filed Jan. 29, 2015, which is incorporated herein by reference.

BACKGROUND OF THE INVENTION

The invention relates to a method and a device for the open-loop and/or closed-loop control at least of one operating parameter of an electrical storage device, wherein said operating parameter influences a state of aging of an electrical energy storage device.

Electrical energy storage devices, in particular traction batteries or high voltage batteries in mild hybrid, hybrid or electric vehicles, are subjected to diverse aging effects and should be designed with regard to the aging effects for a planned serviceable life, preferably for the planned product serviceable life of the motor vehicle.

It is known in the field of automotive technology, so as to monitor the operating state and the aging effects of the electrical energy storage device, to use the prevailing operating variables of the electrical energy storage device, in particular the voltage, the current and the temperature of the electrical energy storage device to calculate the charge state (state of charge (SOC)) or the state of aging (state of health SOH)) of the electrical energy storage device. Methods for ascertaining the state of health of vehicle batteries are by way of example known from U.S. Pat. No. 6,103,408, DE 197 50 309 A or DE 37 12 629 C2, DE 100 49 495 A. A method for predicting the remaining serviceable life of an electrical energy storage device is known by way of example from DE 103 28 721 A1.

In particular, it is known from practical use that the rate of aging of the electrical energy storage device is influenced by the temperature, current loading and the charge cycles. Attempts have therefore been made in the prior art to prevent damage to the electrical energy storage device by virtue of establishing predetermined permissible ranges for these operating parameters of the electrical energy storage device.

So as to limit the aging process caused by the influence of temperature, it is known from the prior art, by way of example DE 10 2007 063 178 A1, DE 10 2007 010 751 A1 or WO 2010/121831 A1, that high voltage batteries of this type are tempered by a cooling system and cooling plates that have fluid flowing through them in order to dissipate any lost heat that occurs so that the permissible operating range for the temperature of the electrical energy storage device never departs from the permissible operating range.

Furthermore, it is known from practical use to provide an overcharge protector and an undercharge protector or to limit the voltage in order to protect electrical energy storage devices from being excessively loaded and consequently from aging rapidly.

However, the known approaches have the disadvantage that electrical energy storage devices age very differently during actual operation, for example depending upon the individual loading, the driving behaviour and the place of use of the vehicle, and consequently said electrical energy storage devices can deviate from the progression of the planned rate of aging even when adhering to such fixedly predetermined operating ranges for the operating parameters of the electrical energy storage device.

BRIEF SUMMARY OF THE PRESENT INVENTION

An object of the invention is to provide an improved operating method for an electrical energy storage device, with which the disadvantages of conventional operating methods can be avoided. More specifically, the object of the invention is to provide an operating method for an electrical energy storage device, with which it is possible to prevent the energy storage device deviating too greatly from the planned serviceable life and in particular to prevent the electrical energy storage device from failing or having to be prematurely exchanged as a result of the aging effects prior to the planned serviceable life coming to an end. It is a further object to provide a device for the closed-loop and/or open-loop control of the electrical energy storage device with which the disadvantages of conventional devices can be avoided.

In accordance with a first aspect of the invention, the mentioned objects are achieved by a method for controlling in an open-loop and/or closed loop manner at least of one operating parameter of the electrical energy storage device, wherein said operating parameter influences a state of aging of an electrical energy storage device.

In accordance with the method, an actual state of health $SOH_{actual}$ of the electrical energy storage device is monitored and determined and a desired state of health $SOH_{desired}$ of the electrical energy storage device is determined. The desired state of health $SOH_{desired}$ is predetermined by a defined rate of aging curve over time. In accordance with the invention, a permissible operating parameter range is adjusted for the at least one operating parameter if a comparison of the actual state of health $SOH_{actual}$ with the desired state of health $SOH_{desired}$ indicates that the actual state of health is demonstrating an increased rate of aging and/or a reduced rate of aging in comparison to the desired state of health $SOH_{desired}$. In the event that an increased rate of aging is established, the operating parameter range is adjusted so that the operation of the electrical energy storage device is performed within the adjusted operating parameter range and consequently the rate of aging reduces so that the progression returns to the desired rate of aging curve or the actual state of health $SOH_{actual}$ is at least moving close to the desired rate of aging curve.

The invention therefore comprises the general technical doctrine whereby the actual state of health $SOH_{actual}$ of the energy storage device is monitored and, in the event of a deterioration of the actual state of health $SOH_{actual}$ in comparison to a desired state of health $SOH_{desired}$ that is expected for the instantaneous age of the energy storage device, the permissible operating parameter range of one or more parameters, which influence the rate of aging of the energy storage device, is adjusted in such a manner that the energy storage device remains functional up to the end of its predetermined desired serviceable life. The relative deviation of the actual state of health $SOH_{actual}$ from the expected desired state of health $SOH_{desired}$ is used as an input variable for a closed-loop control unit or an open-loop control unit, which in dependence upon the relative deviation change the permissible value range of one or more operating parameters that influence the state of health of the energy storage device in order to bring the $SOH_{actual}$ as a regulating variable closer to the $SOH_{desired}$ as a guide variable.

If a comparison of the actual state of health $SOH_{actual}$ with the desired state of health $SOH_{desired}$ indicates that the actual state of aging indicates a reduced rate of aging in comparison to the desired state of health $SOH_{desired}$, the operating parameter range can be adjusted so that the electrical energy storage device is operated within the adjusted operating parameter range at an increased level of aging so that even in this case the rate of aging curve returns to the desired rate of aging curve or the actual state of health $SOH_{actual}$ is at least moving closer to the desired rate of aging curve.

In accordance with this variant, the operating parameter range of the at least one operating parameter is consequently adjusted not only in the case of when it is established that the rate of aging is too rapid but also when the rate of aging is too slow. This provides the advantage that the operating parameter range or ranges is/are adjusted so as to increase the capacity of the energy storage device until the actual state of health $SOH_{actual}$ corresponds again to the desired state of health $SOH_{desired}$ that is to be expected based on the instantaneous serviceable life of the energy storage device.

It is possible to establish an increased and/or reduced rate of aging if the amount of difference between the actual state of health ($SOH_{actual}$) and the desired state of health ($SOH_{desired}$) exceeds a predetermined limit value. The limit value can be set to the value zero so that the operating parameter range that is permissible for the at least one operating parameter is adjusted in the case of each deviation.

However, it is particularly advantageous to set the limit value to an expediently fixed value that is greater than zero so that intervention only occurs in the case of a minimum deviation and the permissible value range is adjusted for the at least one operating parameter. Furthermore, it is possible to define different limit values in each case for defining the increased rate of aging and for defining the reduced rate of aging.

The term "electrical energy storage device", hereinunder also described in short as an energy storage device comprises in particular traction batteries or high voltage batteries for mild hybrid, hybrid or electric vehicles. The term a "traction battery or a high voltage battery" is to be understood to mean a battery or a battery pack for providing electrical energy for a purely electric motorized drive or at least a drive of a motor vehicle that is embodied as a mild hybrid, hybrid or electric vehicle, said drive being supported in an electric motorized manner.

The expression "state of health" or the corresponding acronym "SOH" is also usually used and is used in particular in this document for the term "state of aging", also described as "functional ability".

Methods for determining the actual state of health $SOH_{actual}$, as mentioned in the introduction, are known from the prior art. The state of health is usually quoted in percentage, starting from a starting state of 100%, at which the energy storage device is at its full capacity, up to an end state that is quoted as 0%. A state that is described as 0% means in this context that the energy storage device still has a predetermined minimum capacity, by way of example 80% of the original capacity, and not that said energy storage device is absolutely no longer functional. The starting state is also referred to as the "Beginning of Life" state or BoL-state and the end state also as End of Life or EoL-state. The energy storage device should be exchanged once it has achieved the EoL-state of 0%.

In accordance with a preferred embodiment, the method comprises furthermore the step of determining a remaining serviceable life (remaining mission time) of the electrical energy storage device until said energy storage device presumably achieves the EoL-state. In accordance with this embodiment, the operating parameter range that is permissible for the at least one operating parameter is adjusted in dependence upon the determined remaining mission time in such a manner that the adjustment is greater as the remaining mission time reduces.

This variant provides the advantage that the extent of the adjustment of the operating parameter range, for example the extent of the closed-loop control intervention is automatically adjusted to the time (remaining mission time) that still remains for compensating for the deviation between the actual state of health $SOH_{actual}$ and the desired state of health $SOH_{desired}$. It is possible to use the term remaining usage distance (English: "remaining mission distance") in lieu of "remaining mission time".

The remaining mission time is defined as the time it takes to achieve any definable limit values for the minimum capacity or minimum storage capacity, in other words the predicted duration of the time it takes to achieve the EoL-state. The remaining mission time is usually ascertained by means of extrapolation with the aid of a mathematical model of the energy storage device, cf. for example DE 103 28 721 A1. Alternatively, it is possible in accordance with one variant of this embodiment to also quote the remaining mission distance in lieu of the remaining mission time, in other words by way of example the number of kilometers that can still be driven using the energy storage device before said energy storage device achieves the EoL-state.

In accordance with one advantageous exemplary embodiment, the at least one operating parameter indicates a permissible state of charge window ((SOC)-window) of the electrical energy storage device that defines a permissible minimum state of charge limit $SOC_{min}$ and a permissible maximum state of charge $SOC_{max}$. The minimum state of charge limit $SOC_{min}$ indicates by way of example the minimum level to which the energy storage device may be discharged. In accordance with this exemplary embodiment, the permissible minimum state of charge limit $SOC_{min}$ is increased and/or the permissible maximum state of charge limit $SOC_{max}$ is reduced if the actual state of health demonstrates an increased rate of aging in comparison to the desired state of health $SOH_{desired}$, in other words if the difference between the desired state of health $SOH_{desired}$ and the actual state of health $SOH_{actual}$ exceeds a predetermined threshold value.

Although the amount of energy that is effectively available and can be provided by the energy storage device reduces by virtue of reducing the permissible maximum state of charge limit $SOC_{max}$ and/or by virtue of increasing the permissible minimum state of charge limit $SOC_{min}$, the rate at which the storage device degrades and the rate of aging also reduce as is known in the case of smaller energy fluctuations. In the case of one variant of this exemplary embodiment, it is possible within the scope of the invention to increase the permissible maximum state of charge limit $SOC_{max}$ and/or to reduce the permissible minimum state of charge limit $SOC_{min}$ if the actual state of health demonstrates a reduced rate of aging in comparison to the desired state of health $SOH_{desired}$.

In accordance with a further exemplary embodiment, the at least one operating parameter indicates a maximum permissible charging and/or discharging current or a maximum permissible charge and/or discharging current for a time interval that can be parameterizable. In accordance with this variant, the maximum permissible charging and/or discharging current is reduced if the actual state of health $SOH_{actual}$ demonstrates an increased rate of aging in comparison to the desired state of health $SOH_{desired}$. In accordance with this exemplary embodiment, the limitation of the energy that is supplied or drawn off or the energy supplied or drawn off per time interval is consequently used as a correcting variable in order to influence the aging effects since the rate at which the storage device degrades and the rate of aging also reduce if the amount of energy supplied or used is reduced.

Furthermore, it is also possible within the scope of the invention to increase the maximum permissible charging and/or discharging current or the maximum permissible charging and/or discharging current per time interval if the actual state of health demonstrates a reduced rate of aging in comparison to the desired state of health $SOH_{desired}$.

In accordance with a further exemplary embodiment, the at least one operating parameter indicates a maximum temperature limit for the maximum permissible temperature of the energy storage device. In accordance with this variant, the maximum temperature limit is reduced if the actual state of health demonstrates an increased rate of aging in comparison to the desired state of health ($SOH_{desired}$) and/or the maximum temperature limit is increased if the actual state of health demonstrates a reduced rate of aging in comparison to the desired state of health ($SOH_{desired}$).

The aforementioned exemplary embodiments can be combined so that for example the charging window, the current limits and the maximum temperature limit can be adjusted simultaneously and/or in an alternating manner.

The desired state of health $SOH_{desired}$ indicates the state of health of the energy storage device that is expected for the instantaneous age of the energy storage device. The desired state of health $SOH_{desired}$ can be determined by a stored characteristic curve that indicates a desired state of health $SOH_{desired}$ independence upon a first parameter that is a measurement for a period of time that has elapsed since the commencement of the operation of the electrical energy storage device, and/or in dependence upon a second parameter that is a measurement for the flow of energy to-date through the electrical energy storage device.

In accordance with a further preferred exemplary embodiment, data that indicate a temporal progression to-date of the actual state of health $SOH_{actual}$ of the energy storage device that has been produced by adjusting the operating parameter ranges of at least two operating parameters are used to determine the operating parameter that renders it possible by adjusting its operating parameter range for the actual state of health $SOH_{actual}$ to move as quickly as possible closer to the desired state of health $SOH_{desired}$. In other words, the method in accordance with this aspect can "learn" which operating parameter is suitable most effectively as a correcting variable for the desired reduction of the deviation of the $SOH_{actual}$ from the desired state of health $SOH_{desired}$. The operating parameter that is determined in this manner can be preferably used for open-loop and/or closed-loop control purposes.

In accordance with a further development of the invention, it is possible in the event of a deviation of the actual state of health ($SOH_{actual}$) from the desired state of health ($SOH_{desired}$) of the electrical energy storage device to predict a future progression of the actual state of health ($SOH_{actual}$) on the basis of stored data relating to the usage of the electrical energy storage device, wherein the operating parameter range that is permissible for the at least one operating parameter is adjusted in dependence upon the predicted future progression of the actual state of health ($SOH_{actual}$).

The stored usage data can indicate by way of example current profiles of the usage to-date in the form of load spectrums. A permissible current range of the energy storage device of for example, 0 to 100 A can be divided into individual classes, for example 0 to 10 A, 10 to 20 A, . . . 90 to 100 A, so that stored data of the load collective that indicate how often or how long each current class has been used in the operation to-date of the energy storage device and what effect the usage of the different current classes has on the actual state of health, which can be determined for example by corresponding usage data that indicate a change of the internal resistance. In other words, the method in accordance with this aspect can "learn" how a particular usage profile of the energy storage device influences the rate of aging of said energy storage device in order in response thereto to optimize its operating parameters. If a usage profile is repeated in the actual operation, it is possible using the stored usage data or usage history to estimate or predict the influence on the state of health of the energy storage device. If the further progression of a deviation of the actual state of health ($SOH_{actual}$) from the desired state of health ($SOH_{desired}$) of the electrical storage device is estimated in this manner, this can be taken into consideration when adjusting an operating parameter range. By way of example, the extent of the adjustment of the operating parameter range can be selected to be greater, the greater the estimated progression of the deviation of the actual state of health ($SOH_{actual}$) from the desired state of health ($SOH_{desired}$) using the usage data.

The usage data can also include the through-flow of energy to-date per time.

It is possible in accordance with a further development of the invention to adjust by a simulation process an operating parameter range that is permissible for the at least one operating parameter. The simulation process uses a model of the serviceable life of an energy storage device and a predetermined usage profile of the serviceable life of the energy storage device and calculates in dependence thereon a development of the actual state of health ($SOH_{actual}$) which adjustment of the operating parameter range to perform on which operating parameter. It is possible using the simulation process to predict which adjustment of the operating parameter range and/or which operating parameter renders it possible for the desired state of health ($SOH_{desired}$) to be approached in an optimum manner. As a consequence, the optimum set of operating variables can be determined in an iterative manner, said set rendering possible an optimum usage of the storage device on the basis of the predetermined desired state of health and an assumed usage behaviour.

In accordance with a second aspect of the invention, the object is achieved by a device for the open-loop and/or closed-loop control at least of one operating parameter of the electrical storage device, wherein said operating parameter influences a state of aging of an electrical energy storage device and said energy storage device is designed so as to implement the method disclosed herein.

In order to avoid repetitions, features that are disclosed solely with regard to the method are also deemed to be disclosed with regard to the device and are claimable.

In accordance with a preferred embodiment, the device comprises a first control unit for the open-loop control of the drive train components of the motor vehicle, said control unit in particular also defines the extent to which the electrical machine contributes to the required drive torque and accordingly controls the inverter of the electrical machine; and a second control unit for the open-loop control of the electrical energy storage device.

The first control unit is embodied so as to determine the desired state of health $SOH_{desired}$ of the electrical energy storage device and to transmit said data to the second control unit; to receive an adjusted operating parameter range of the at least one operating parameter of the electrical energy storage device from the second control unit and whilst taking into consideration the received operating parameter range at least of one operating parameter of the electrical storage device to control an inverter of the electrical energy storage device.

The second control unit is embodied so as to determine the actual state of health $SOH_{actual}$ of the electrical energy storage device, to receive the determined desired state of health $SOH_{desired}$ from the first control unit and to adjust the permissible operating parameter range for the at least one operating parameter and to transmit said data to the first control unit.

Furthermore, the invention relates to a motor vehicle, preferably a commercial vehicle, having a control unit as disclosed herein.

BRIEF DESCRIPTION OF THE DRAWINGS

The previously described preferred embodiments and features of the invention can be combined with one another as desired. Further details and advantages of the invention are described hereinunder with reference to the attached drawings, in which.

DETAILED DESCRIPTION OF THE PREFERRED EMBODIMENTS

Figure 1:
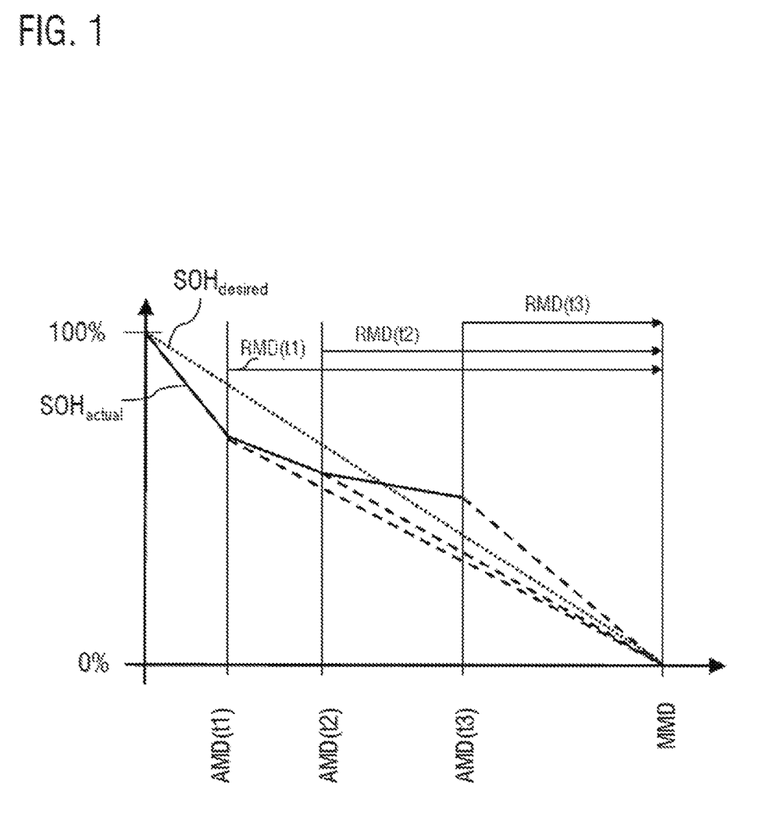
FIG. 1 illustrates a progression of the closed-loop control of the actual state of health $SOH_{actual}$ in comparison to the desired state of health $SOH_{desired}$ of the electrical energy storage device.

FIG. 1 illustrates a progression of the controlled actual state of health $SOH_{actual}$ over the usage distance of the energy storage device in comparison to the desired state of health $SOH_{desired}$ of the electrical energy storage device.

The dotted line described as the $SOH_{desired}$ describes the permissible desired rate of aging of the energy storage device in dependence upon the usage distance or driving distance that has been covered, in which the electrical energy storage device was in operation (mission distance). Starting from an initial state of 100%, at which the energy storage device is at its full capacity, the energy storage device ages, in other words its capacity reduces to a state of health "EoL" of 0%, as already described above. Although the energy storage device is still functional in this state, it should however be exchanged promptly. The mission distance that can be covered from commencement of operation until achieving the state of health 0% should be at least the desired usage distance (maximum mission distance (MMD)) for which the energy storage device can be accordingly designed.

Figure 2:
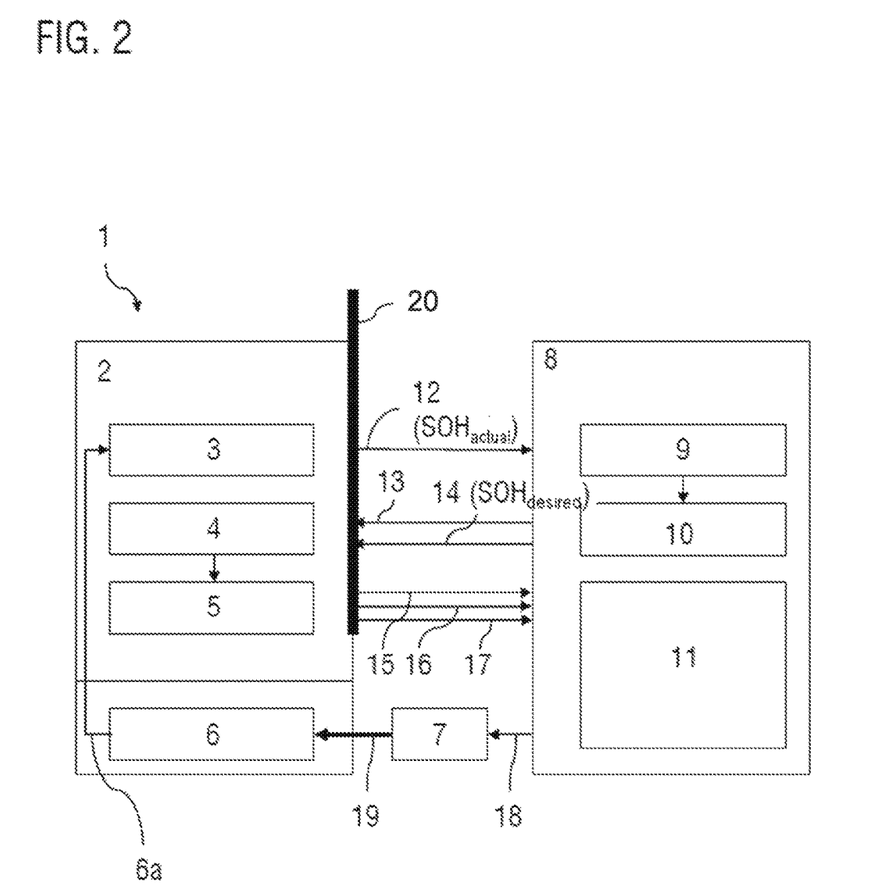
FIG. 2 illustrates a schematic block diagram for illustrating a device in accordance with one embodiment of the invention and for illustrating the method in accordance with one embodiment of the invention.

The progression of the dotted line represents a characteristic curve that is stored in the storage device of a closed-loop control unit that is further described hereinunder in connection with FIG. 2. The characteristic curve $SOH_{desired}$ is determined in advance in dependence upon a load spectrum, in other words an estimated current profile with which the electrical energy storage device is loaded in the case of typical driving cycles over its serviceable life. The battery manufacturer designs the electrical energy storage device in dependence upon this characteristic curve. If the electrical energy storage device is loaded during the actual driving operation with a similar load spectrum, the actual rate of aging of the electrical energy storage device $SOH_{actual}$ extends as the desired state of health $SOH_{desired}$ in accordance with the characteristic curve.

Current loadings of the energy storage device during the actual driving operation generally deviate therefrom so that the actual rate of aging $SOH_{actual}$ of the energy storage device is quicker or slower than the characteristic curve $SOH_{desired}$. The actual rate of aging $SOH_{actual}$ of the energy storage device is illustrated in FIG. 1 by the continuous line.

The respective remaining mission distances RMD(t1), RMD(t2) and RMD(t3), which are produced from the difference between the desired mission distance (MMD) and the respective mission distance covered to-date AMD(t1), AMD(t2) and AMD(t3), are calculated at the different points in time t1, t2 and t3 when the evaluation is performed.

The actual state of health $SOH_{actual}$ of the electrical storage device is determined at the different points in time t1, t2 and t3 when the evaluation is performed. Furthermore, the characteristic curve is used to determine the desired state of health $SOH_{desired}$ of the electrical storage device at the point RMD(t) for the actual value of the remaining mission distance RMD(t).

It is possible in lieu of the mission distance that has been covered to also plot the time on the x-axis. The maximum mission distance would then correspond to the desired serviceable life (maximum mission time). In lieu of the respective remaining mission distances RMD(t1), RMD(t2) and RMD(t3) that are remaining, the mission time that remains (remaining mission time) at the points in time when the evaluation is performed would then be calculated in each case.

If the real actual state of health $SOH_{actual}$ deviates from the determined desired state of health $SOH_{desired}$ by more than a predetermined threshold value, the correction values of the correcting variables are adjusted. The correcting variables are the operating parameters of the energy storage device that influence the rate of aging of the energy storage, in particular the permissible state of charge window of the electrical energy storage device (SOC-window) and the maximum permissible charging and/or discharging currents of the energy storage device and the maximum permissible charging and/or discharging currents per time interval. The permissible operating parameter ranges of these operating parameters are adjusted as desired values so that the adjusted operating parameter ranges cause a reduction of the deviation of the real actual state of health $SOH_{actual}$ from the desired state of health $SOH_{desired}$.

It is established at the points in time t1 and t2 for example that the energy storage device ages too quickly in comparison to the characteristic curve $SOH_{desired}$, is consequently reduced at these points as a result by way of example the permissible state of charge window. By way of example, the minimum state of charge limit ($SOC_{min}$) that indicates the minimum end charge level of the nominal capacity can be increased for example 20%, and/or the maximum state of charge limit ($SOC_{max}$) can be reduced.

Furthermore, the maximum permissible charging and/or discharging current for a parameterizable time interval, in other words the maximum current that may be drawn off from the energy storage device over a determined time period can be set to a smaller value in order to decelerate the rate of aging.

In contrast, it is established in accordance with FIG. 1 at the point in time t3 that the percentage value of the actual state of health $SOH_{actual}$ is greater than the desired state of health $SOH_{desired}$, in other words the energy storage device is aging at a slower rate than in accordance with the characteristic curve. Consequently, by way of example, the permissible state of charge window is increased at these points and/or the maximum permissible charging and discharging currents are increased, as a consequence of which the capacity of the energy storage device is increased and its rate of aging is accelerated.

The correction values of the correcting variables are selected so that the deviation of the $SOH_{actual}$ with respect to the $SOH_{desired}$ is reduced to zero upon achieving the desired mission distance (MMD), which is illustrated by the broken lines in FIG. 1. As is evident in FIG. 1, the correcting variables—and consequently the limitation of the permissible ranges of the battery operating parameters—become more intense towards the end point of the desired mission distance MMD, since the closed-loop control unit always has less time for the control process. Consequently, the shorter the remaining mission distance or remaining serviceable life, the greater the level of intervention by the closed-loop control unit.

The broken lines in the figures thus represent an imaginary desired progression of the actual state of health $SOH_{actual}$ starting from the respective evaluation point in time. Since, however, for example starting from the point in time t1, the actual progression of $SOH_{actual}$ deviates in accordance with the continuous lie from the broken line, a fresh adjustment of the correcting variables is performed at the point in time t2.

FIG. 2 illustrates by way of example a schematic block diagram for illustrating an exemplary embodiment of a closed-loop control unit for forming a control loop in order to adjust the actual state of health $SOH_{actual}$ of the electrical storage device as a control variable to the desired state of health $SOH_{desired}$ as a guide variable.

The reference numeral 1 describes a traction battery of a motor vehicle that comprises in a manner known per se a battery pack 6 comprising multiple individual cells. Furthermore, the battery comprises a control unit 2. The reference numeral 8 describes a vehicle control unit for controlling the drive train components (combustion engine, coupling, electrical drive machine etc.) of the motor vehicle. In particular, the parameters 18 are formed for the inverter 7 of the electrical drive machine whilst taking into consideration the permissible operating variables of the battery.

The control unit 2 of the traction energy and the vehicle control unit 8 form the control unit of a control loop for the purpose of controlling the actual state of health of the battery 1 in line with the desired state of health. The two control units exchange the required variables by way of the CAN data bus 20. The exchange is illustrated schematically by the black arrows in FIG. 2.

For this purpose, the control unit 2 is embodied in a manner known per se so as to use an $SOH_{actual}$-calculating unit 3 continuously or regularly to determine the real actual state of health $SOH_{actual}$ of the battery as the control variable, for which purpose the $SOH_{actual}$-calculating unit 3 receives by way of the signal line 6a corresponding current and voltage measurement values from the battery pack 6.

The vehicle control unit 8 comprises a calculating unit 10 that determines in each case the current desired state of health $SOH_{desired}$ as a guide variable corresponding to the points in time for calculating the $SOH_{actual}$ of the battery. In the normal case, the $SOH_{desired}$ is calculated according to the above mentioned characteristic curve, in that the vehicle control unit calculates the actual remaining mission distance or the actual remaining mission time and determines the associated desired state of health $SOH_{desired}$ in accordance with the characteristic curve. The actual remaining mission time can be determined by way of example from the difference between the desired mission time and the duration of the lapsed time since the production of the vehicle.

However, the vehicle control unit 8 has as an option the possibility to take into consideration special effects. If the vehicle is left standing, for example for longer periods of time without usage, the battery still ages (calendar life). The SOH desired parameter can then deviate from the characteristic curve. For this purpose, the determined actual state of health $SOH_{actual}$ can be transmitted by the control unit 2 to the vehicle control unit 8 (arrow 12) and said vehicle control unit uses this data in a further calculating unit 9 to calculate an offset of the actual desired state of health $SOH_{desired}$. The calculating unit 9 uses the usage data of the previous vehicle operating behaviour.

The determined actual state of health $SOH_{actual}$ and the calculated actual remaining mission distance RMD or the remaining mission time are transmitted to the battery control unit 2 (illustrated by the arrows 13 and 14).

The control unit 2 uses the difference between $SOH_{actual}$ and $SOH_{desired}$ of the battery to calculate adjusted operating parameter ranges as a correcting value for the operating variables of the energy storage device (correcting variables) that significantly influence the rate of aging of the energy storage device 1.

An analysis is initially performed for this purpose in a first calculating unit 4, wherein, with reference to data relating to the temporal progression of the actual state of health ($SOH_{actual}$) and in dependence upon the adjustment of the operating parameter ranges, the operating parameter is determined that renders it possible by adjusting its operating parameter range for the actual state of health ($SOH_{actual}$) to move closer to the desired state of health ($SOH_{desired}$) as quickly as possible. In other words, the change in SOH is evaluated in the case of specific battery operating variables, in other words by way of example the SOC charging window and the limits for the maximum permissible charging and/or discharging currents are evaluated within the scope of an "online-adaption" of the SOH control unit 2, 8. Thus, the SOH control unit 2, 8 can "learn" from previous data which change to the correcting variable (SOC charging window or permissible charging and/or discharging currents) leads most effectively to the desired reduction of the control error.

Multiple possible further developments of the closed-loop control process are optionally feasible. By way of a deterministically derived decision tree and whilst taking into consideration the SOH deviation, the operating variables are adjusted in a linear manner and measures for adjusting the operating parameter ranges, such as the SOC-window, current limits and temperature ranges are combined with one another or applied in sequence. Furthermore, it could be possible by means of a method with which the storage device analyses its previous usage history, and in the presence of a SOH deviation to independently predict the further rate of aging on the basis of the historic data and subsequently optimize the operating parameters of the energy storage device. In accordance with a further development, the storage device could independently simulate various sets of possible operating parameters and thus determine in an iterative manner the optimum set of operating variables that renders possible the maximum use of the storage device on the basis of the customer behaviour and the SOH parameter.

The calculating unit 4 transmits the result in the form of the parameter(s) that is/are to be used as correcting variables to an calculating unit 5 that then calculates adjusted permissible value ranges for the operating parameters. If the control deviation between $SOH_{actual}$ and $SOH_{desired}$ is minimal, the calculating unit 5 hardly adjusts the operating variables or does not adjust said operating variables at all.

The remaining mission distance RMD or the remaining mission time transmitted by the vehicle control unit 8 indicates how much time remains for the control process. The shorter the remaining mission distance RMD or remaining mission time, the greater the control intervention needs to be so that the remaining mission distance or remaining mission time is taken into consideration when defining the extent of the adjustment to the operating parameter ranges.

The calculating unit 5 calculates by way of example changed values for the permissible minimum state of charge limit $SOC_{min}$ and the permissible maximum state of charge limit $SOC_{max}$ and transmits the values to the vehicle control unit 8 (illustrated by the arrow 17). The calculating unit 5 calculates by way of example moreover the henceforth permissible value ranges for the maximum permissible discharging and charging currents of the energy storage device 1 and the maximum permissible discharging and charging voltages and transmits the adjusted values likewise to the vehicle control unit 8 (illustrated by the arrow 15 and 16).

The received values are used by a control module 11 of the vehicle control unit 8, said control module requiring a driving torque from the various drives. The control module 8 requests a corresponding torque from the electrical machine by way of its inverter 7 (illustrated by the arrow 18) but whilst maintaining the adjusted permissible value ranges for the battery operating parameters. Accordingly, the inverter 7 requests a battery current 19 from the battery pack 6 whilst maintaining the adjusted permissible value ranges for the battery operating parameters. The control loop starts afresh with a renewed determination of the real actual state of health $SOH_{actual}$.

The object of the control module 11 is to maximize the potential fuel saving which is generally achieved by using the electrical machine and consequently the traction battery 1 more intensely. The control module 11 will therefore use the electrical drive machine and consequently the traction battery 1 more intensely in the case of minimal limitation of the battery operating variables. The more intense use will lead to an accelerated aging of the battery, following which the battery controls the occurring control error by virtue of limiting the battery operating variables. The single correcting variable of the control module 11 is the use of the electrical machine which has a direct effect on the battery current 19 that is required by the traction battery 1. The requested battery current 19 must not exceed the operating variables reported by the battery. The requested battery current 19 must consequently only be of such a high value that the SOC-window reported by the battery is still maintained. In accordance with the invention, a self-regulating closed-loop control distance is provided that ensures that the operating mode and rate of aging of the energy storage device are self-regulating in order to ensure an operation within the design limits up to the expiry of the desired serviceable life.

Although the invention is described with reference to specific exemplary embodiments, it is evident to the person skilled in the art that various changes can be performed and equivalents can be used as a substitute without departing from the scope of the invention. In addition, many modifications can be performed without departing from the associated scope. Consequently, the invention is not to be limited to the disclosed exemplary embodiments but rather is to include all exemplary embodiments that are included in the scope of the attached claims. In particular, the invention also claims protection for the subject and the features of the subordinate claims independently of the claims to which reference is made.

LIST OF REFERENCE NUMERALS

1 Electrical energy storage device
2 Control unit of the electrical energy storage device
3 $SOH_{actual}$-calculating unit
4 Calculating unit
5 Operating parameter calculating unit
6 Battery pack
6a Signal line
7 Inverter
8 Vehicle control unit
9 Calculating unit
10 $SOH_{desired}$—and remaining mission time calculating unit
11 Control module
12 Transmitting the calculated $SOH_{actual}$
13 Transmitting the remaining mission time
14 Transmitting the $SOH_{desired}$
15-17 Transmitting the adjusted operating parameter ranges
18 Inverter control signal
19 Battery current

The invention claimed is:

1. A method for at least one of open-loop and closed-loop control of at least one operating parameter of an electrical energy storage device of a motor vehicle, wherein the at least one operating parameter influences a state of aging of the electrical energy storage device, said method comprising the following steps:
determining an actual state of health ($SOH_{actual}$) of the electrical energy storage device;
determining a desired state of health ($SOH_{desired}$) of the electrical energy storage device;
determining one of a remaining mission time and a remaining mission distance of the electrical energy storage device until the electrical energy storage device achieves an "End of Life"-state of health; and
adjusting an operating parameter range that is permissible for the at least one operating parameter if a comparison of the actual state of health ($SOH_{actual}$) with the desired state of health ($SOH_{desired}$) indicates that the actual state of health demonstrates an increased rate of aging in comparison to the desired state of health ($SOH_{desired}$) and if the comparison of the actual state of health ($SOH_{actual}$) with the desired state of health ($SOH_{desired}$) indicates that the actual state of health demonstrates a reduced rate of aging in comparison to the desired state of health ($SOH_{desired}$), wherein the operating parameter range is adjusted so that the electrical energy storage device is operated within the adjusted operating parameter range
at a reduced rate of aging if the comparison indicates that the actual state of health demonstrates an increased rate of aging, and at an increased rate of aging if the comparison indicates that the actual state of health demonstrates a reduced rate of aging; and wherein the step of adjusting the operating parameter range that is permissible for the at least one operating parameter is performed in dependence upon the one of the determined remaining mission time and the remaining mission distance in such a manner that the adjusting is greater as the one of the remaining mission time and the remaining mission distance reduces.

2. The method according to claim 1, wherein the step of adjusting the operating parameter range that is permissible for the at least one operating parameter is performed only if the value of the difference between the actual state of health ($SOH_{actual}$) and the desired state of health ($SOH_{desired}$) exceeds a predetermined threshold value.

3. The method according to claim 1, wherein the at least one operating parameter is a permissible state of charge window of the electrical storage device that defines a permissible minimum state of charge limit ($SOC_{min}$) and a permissible maximum state of charge limit ($SOC_{max}$); and the step of adjusting includes
if the actual state of health demonstrates an increased rate of aging in comparison to the desired state of health ($SOH_{desired}$), at least one of increasing the permissible minimum state of charge limit ($SOC_{min}$) and reducing the permissible maximum state of charge limit ($SOC_{max}$), and if the actual state of health demonstrates a reduced rate of aging in comparison to the desired state of health ($SOH_{desired}$), at least one of decreasing the permissible minimum state of charge limit ($SOC_{min}$) and increasing the permissible maximum state of charge limit ($SOC_{max}$).

4. The method according to claim 1, wherein that the at least one operating parameter is at least one of a maximum permissible charging current, a maximum discharging current, a maximum permissible charging current for a parameterizable time interval, and a discharging current for a parameterizable time interval; and the step of adjusting includes
if the actual state of health ($SOH_{actual}$) demonstrates an increased rate of aging in comparison to the desired state of health ($SOH_{desired}$), reducing the at least one of a maximum permissible charging current, a maximum discharging current, a maximum permissible charging current for a parameterizable time interval, and a discharging current for a parameterizable time interval; and if the actual state of health ($SOH_{actual}$) demonstrates a reduced rate of aging in comparison to the desired state of health ($SOH_{desired}$), increasing the at least one of a maximum permissible charging current, a maximum discharging current, a maximum permissible charging current for a parameterizable time interval, and a discharging current for a parameterizable time interval.

5. The method according to claim 1, wherein the at least one operating parameter is a maximum temperature limit for the maximum permissible temperature of the electrical energy storage device; and the step of adjusting includes
if the actual state of health demonstrates an increased rate of aging in comparison to the desired state of health ($SOH_{desired}$), reducing the maximum temperature limit; and if the actual state of health demonstrates a reduced rate of aging in comparison to the desired state of health ($SOH_{desired}$), increasing the maximum temperature limit.

6. The method according to claim 1, wherein the step of determining the desired state of health ($SOH_{desired}$) includes using a stored characteristic curve that indicates a measurement at least one of for a period of time that has elapsed since the commencement of the operation of the electrical energy storage device, and in dependence upon a second parameter that is a measurement for the through-flow of energy to-date through the electrical energy storage device.

7. The method according to claim 1, wherein the at least one operating parameter includes at least two operating parameters, and with reference to data that indicate a temporal progression to-date of the actual state of health ($SOH_{actual}$) of the electrical energy storage device, the method further comprises determining one of the at least two operating parameters for which the adjusting of the operating parameter range moves the actual state of health ($SOH_{actual}$) closer to the desired state of health ($SOH_{desired}$) the quickest.

8. The method according to claim 1, wherein, in the event of the actual state of health ($SOH_{actual}$) deviating from the desired state of health ($SOH_{desired}$) of the electrical energy storage device, a future progression of actual state of health ($SOH_{actual}$) is predicted on the basis of stored usage data of the electrical energy storage device, wherein the operating parameter range that is permissible for the at least one operating parameter is adjusted in dependence upon the predicted future progression of the actual state of health ($SOH_{actual}$).

9. The method according to claim 1, wherein the step of adjusting an operating parameter range that is permissible for the at least one operating parameter includes performing a simulation process that simulates a development of the actual state of health ($SOH_{actual}$) for at least one of:

different adjustments of the operating parameter range of the at least one operating parameter; and different adjustments of the operating parameter range of different ones of the at least one operating parameter of the electrical energy storage device while using a model of the serviceable life of the energy storage device and a predetermined usage profile of the serviceable life of the energy storage device, wherein the adjustment of the operating parameter range that renders it possible for the actual state of health ($SOH_{actual}$) to move closer to the desired state of health ($SOH_{desired}$) in an optimum manner is determined by the simulation process.

10. A control unit for at least one of open-loop and closed-loop control of at least one operating parameter of an electrical energy storage device of a motor vehicle, wherein said at least one operating parameter influences a state of aging of the electrical energy storage device, said control unit being configured to implement the method according to claim 1.

11. The device according to claim 10, further comprising:
a first control unit for the open-loop control of drive train components of the motor vehicle; and
a second control unit for the open-loop control of an electrical energy storage device,
wherein the first control unit is configured to determine the desired state of health ($SOH_{desired}$) of the electrical energy storage device and to transmit the determined desired state of health ($SOH_{desired}$) to the second control unit, receive an adjusted operating parameter range of the at least one operating parameter of the electrical energy storage device from the second control unit, and control an inverter of the electrical energy storage device while taking into consideration the received operating parameter range of the at least one operating parameter of the electrical energy storage device; and wherein the second control unit is configured to determine the actual state of health ($SOH_{actual}$) of the electrical energy storage device, receive the determined desired state of health ($SOH_{desired}$) from the first control unit, adjust the permissible operating parameter range for the at least one operating parameter, and transmit the adjusted permissible operating parameter range to the first control unit.

12. A motor vehicle, comprising a control unit according to claim 10.

13. The motor vehicle according to claim 12, wherein the motor vehicle is a commercial vehicle.

* * * * *